United States Patent [19]
Sakamoto et al.

[11] Patent Number: 5,363,072
[45] Date of Patent: Nov. 8, 1994

[54] HIGH-FREQUENCY POWER DIVIDER-COMBINER

[75] Inventors: Hironori Sakamoto; Akira Ito, both of Tokyo; Toshio Nojima, Yokosuka, all of Japan

[73] Assignees: Japan Radio Co., Ltd.; Nippon Telephone & Telegraph Corporation; NTT Mobile Communication Network Inc., all of Tokyo, Japan

[21] Appl. No.: 965,171

[22] Filed: Oct. 23, 1992

[30] Foreign Application Priority Data

Oct. 29, 1991 [JP] Japan ................................. 3-283315

[51] Int. Cl.$^5$ .............................................. H01P 5/12
[52] U.S. Cl. ................................................. 333/125
[58] Field of Search ................. 333/246, 125, 128; 330/124 D, 295

[56] References Cited

U.S. PATENT DOCUMENTS

| | | |
|---|---|---|
| 3,522,550 | 8/1970 | Golombelt et al. . |
| 3,953,702 | 4/1976 | Bickel .................. 219/10.55 R |
| 4,885,557 | 12/1989 | Barczys ...................... 333/124 |
| 4,893,093 | 1/1990 | Cronauer et al. . |
| 4,965,530 | 10/1990 | Katz ........................ 330/295 |
| 5,032,798 | 7/1991 | Myer . |

OTHER PUBLICATIONS

IEEE 1990 International Radar Conference, May 7–10, 1990, Arlington, US, New York US, 1990, J. D. Hay et al., "The Exploratory Development of a High Power S-Band Solid State Radar Transmitter", pp. 135–140.

Primary Examiner—Robert J. Pascal
Assistant Examiner—Darius Gambino
Attorney, Agent, or Firm—Frishauf, Holtz, Goodman & Woodward

[57] ABSTRACT

In a power amplifying apparatus which has a high-frequency power divider and combiner and two to four parallel-operated power amplifiers, in which a change is made in the number of the parallel-operated power amplifiers so as to adjust output power, there are provided a power dividing circuit $D_1$ having a transmission line $Wd_{51}$ serving as an impedance transformer set in such a manner that the power loss is minimized by assigning an intermediate number 3 between 2 and 4 both of which indicate the number of divisions, and having four output terminals, and a power combining circuit $S_1$ having a transmission line $Ws_{51}$ serving as an impedance transformer set in such a manner that the power loss is minimized by assigning the intermediate number 3 indicative of the number of combinations, and having four input terminals.

7 Claims, 5 Drawing Sheets

HIGH-FREQUENCY POWER DIVIDER-COMBINER

BACKGROUND OF THE INVENTION

1. Field of the Invention

The present invention relates to a high-frequency power divider and combiner, and more specifically to a circuit for dividing and combining high-frequency power when a plurality of power amplifiers are parallel-operated.

2. Description of the Related Art

As power dividing and combining circuits for parallel-operating power amplifiers and combining together outputs produced from the power amplifiers so as to obtain large power, there have heretofore been used a 3 dB coupler type power divider and combiner, a Wilkinson's power divider and combiner, and an impedance transformer type power divider and combiner.

In a power amplifying apparatus of a type wherein a plurality of power amplifiers are parallel-operated to generate output power, which is then combined so as to produce large power, allowable output power is often controlled by changing the number of the power amplifiers. A description will now be made, as an illustrative example, of a case in which the input and output impedance in circuits are set to 50Ω, and wherein two, three or four power amplifiers are parallel-operated to thereby control allowable output power of a power amplifying apparatus.

When the 3 dB coupler type power divider and combiner is used, the power can be efficiently divided and combined only when the number of power amplifiers to be parallel-operated is $2^n$. On the other hand, when the Wilkinson's power divider and combiner is used, the power can be efficiently divided and combined when the number of parallel operating power amplifiers is an even number. In either case where the number of power amplifiers to be parallel-operated is four, the power amplifiers can be efficiently parallel-operated by using a 4-way divider and a 4-way combiner. However, when the number of the power amplifiers is reduced from four to three or two, the power is used up by resistances as dummy loads for absorbing unbalanced power, which are used to obtain isolation between terminals of dividers and between those of combiners. Therefore, a power loss of about 2.5 dB is developed when the three power amplifiers are used, whereas a power loss of about 6.0 dB is developed when the two power amplifiers are used.

In order to efficiently divide the power and combine it in 2-way combination form, it is necessary to replace the divider and the combiner with a 2-way divider and a 2-way combiner respectively. When the divider and the combiner are replaced by others respectively, the operation of a power amplifying apparatus should be temporarily stopped. Therefore, the 3 dB coupler type power divider and combiner and the Wilkinson's power divider and combiner are not suited to a method of making the change in the number of the units of the power amplifiers to thereby adjust or control the allowable output power of the apparatus.

Figure 6A:
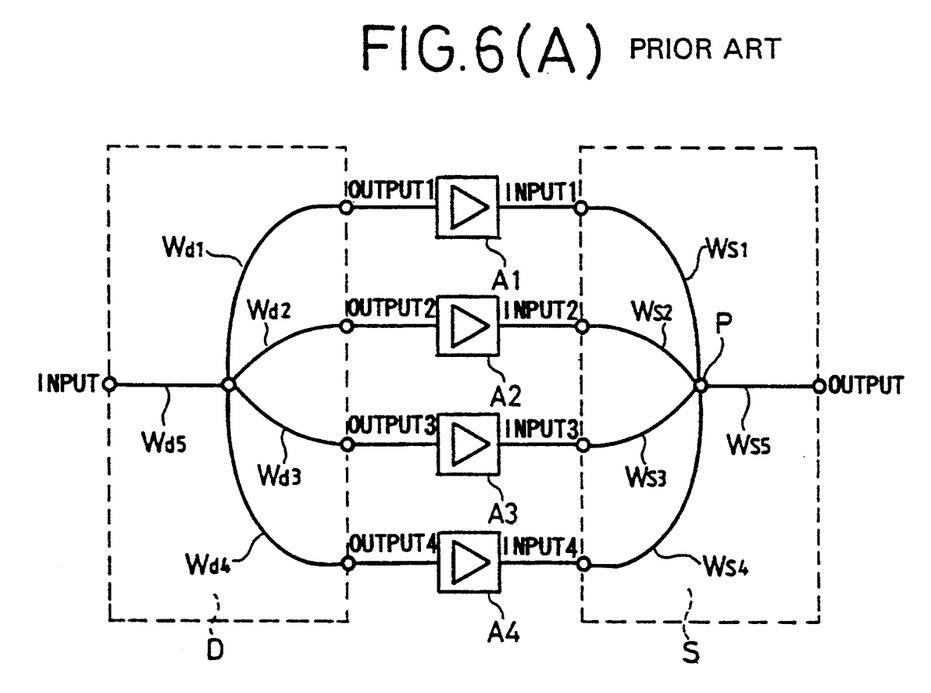
FIG. 6(A) is a block diagram depicting the structure of a conventional example illustrative of impedance transformer type 4-way divider and 4-way combiner.
Figure 6B:
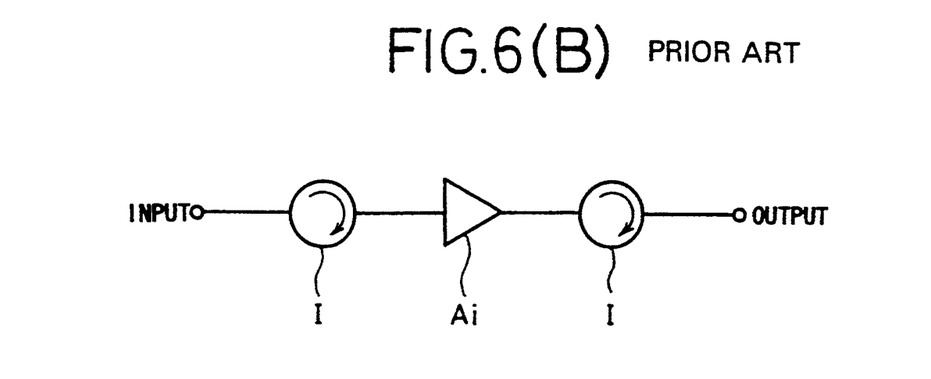
FIG. 6(B) is a block diagram showing the structure of a conventional example in which isolation between respective output terminals of a divider and isolation between respective input terminals of a combiner are obtained by isolators I or circulators electrically connected to inputs and outputs of respective power amplifiers Ai.

Accordingly, an impedance transformer type 4-way divider and 4-way combiner will be shown in FIG. 6(A) as one example. In FIG. 6(A), D indicates a power dividing circuit (hereinafter called merely a "divider") and S indicates a power combining circuit (hereinafter called merely a "combiner"). In addition, $A_1$ through $A_4$ indicate power amplifiers respectively. However, the impedance transformer type divider and combiner, different from the 3 dB coupler type power divider and combiner and the Wilkinson's power divider and combiner, provide no resistance as a dummy load for unbalanced power absorption, but only an impedance matching function is provided and hence no isolation is obtained between terminals. Therefore, the isolation between adjacent output terminals for outputs 1 through 4 of the divider and the isolation between adjacent input terminals for inputs 1 through 4 of the combiner are obtained from either isolators or circulators provided at inputs and outputs of respective power amplifiers Ai as shown in FIG. 6(B).

The combiner S and the divider D are identical in principle to each other. A description will therefore be made of the combiner S as an illustrative example. Transmission lines $Ws_1$ through $Ws_4$ each having an impedance of 50Ω and a line length of $n\lambda/2$ (where n=positive integer and λ=wavelength of a used frequency) are provided between the respective input terminals of the combiner S and a combining point P thereof. Since the lines of 50Ω impedance are 4-way combined, the impedance at the combining point P is brought to 12.5Ω (=50 Ω/4).

An impedance transformer is used to convert or transform the impedance at the combining point P into output impedance of 50Ω. For example, the impedance transformer is composed of a transmission line $Ws_5$ having the impedance of 25Ω and a line length of λ/4. Incidentally, the divider D is also constructed in a manner similar to the combiner S. In this case, transmission lines $Wd_1$ through $Wd_4$ correspond to the transmission lines $Ws_1$ through $Ws_4$ and a transmission line $Wd_5$ serving as the impedance transformer corresponds to the transmission line $Ws_5$. By setting the combiner S and the divider D in this way, a division loss is 0 db whereas a combination loss is 0 dB, which result in the total loss of 0 dB.

Figure 7:
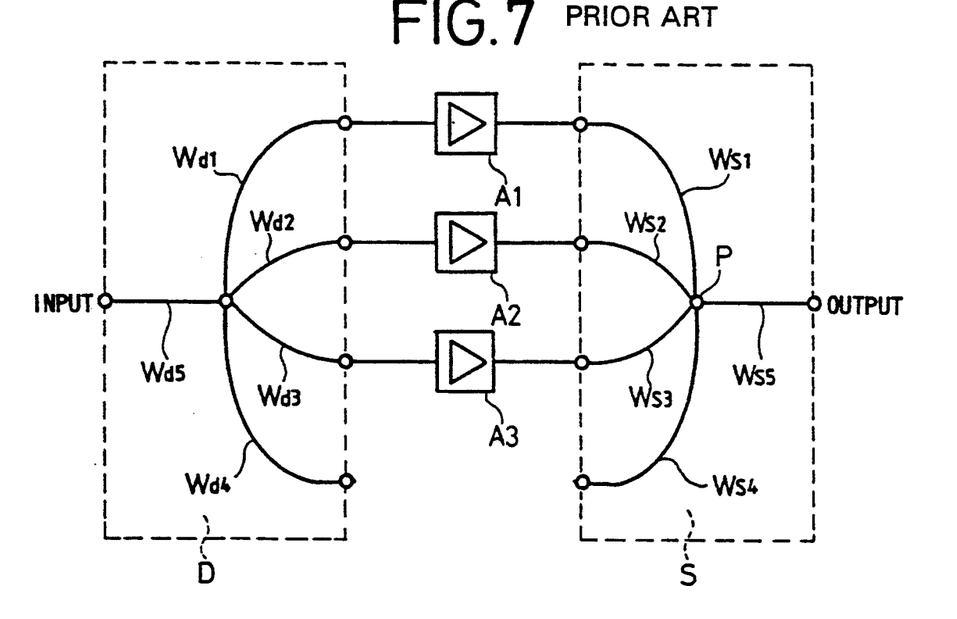
FIG. 7 is a block diagram showing the structure of the conventional example depicted in FIG. 6(A), which is applied to a 3-way division and a 3-way combination.

A description will now be made of a case in which the control of allowable output power is carried out by making a change in the number of power amplifiers. As shown in FIG. 7, one of input terminals of a 4-way combiner S is opened and three power amplifiers are connected in parallel to the corresponding input terminals so as to produce the output of the 4-way combiner in the form of 3-combination. The length of each of transmission lines, which extend from the power amplifiers $A_1$, $A_2$, $A_3$ to a combining point P, is $n\lambda/2$. Thus, the impedance as seen in the direction of the opened input terminal of the 4-way combiner from the combining point P is equivalently brought to infinity. Therefore, the impedance at the combining point P reaches about 16.7Ω (=50 Ω/3).

Further, an impedance transformer, which extends from the combining point P to the output terminal, is constructed so as to transform 12.5Ω into 50 Ω. Thus, when this impedance transformer is used so as to transform 16.7Ω into 50Ω, the reflection coefficient produced due to impedance mismatching is determined by the following equation:

$$\begin{aligned}\text{Reflection coefficient} &= (Z_L - Z_O)/(Z_L + Z_O) \\ &= (16.7 - 12.5)/(16.7 + 12.5) \\ &= 0.144\end{aligned}$$

The reflection loss produced due to the impedance mismatching is determined by the following equation:

$$\begin{aligned}\text{Reflection loss} &= 10\log[1/(1 - \text{reflection coefficient}^2)] \\ &= 10\log[1/(1 - 0.144^2)] \\ &= 0.09 \text{ dB}\end{aligned}$$

Thus, the reflection loss is brought to about 0.09 dB.

The divider D also gives rise to the reflection loss in a manner similar to the combiner S. Therefore, the reflection loss is doubled over the entire device, that is, the reflection loss amounts to about 0.18 dB.

Figure 8:
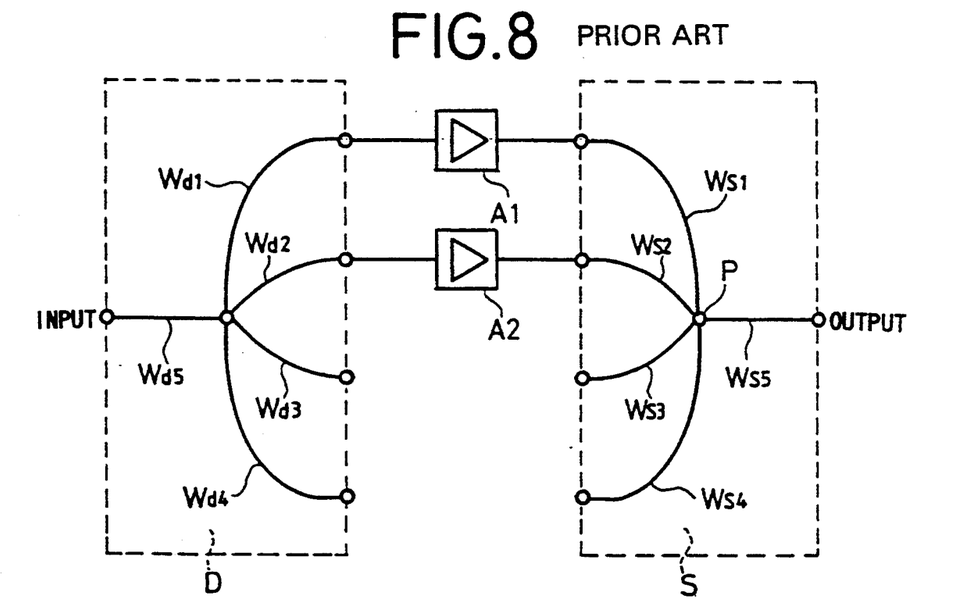
FIG. 8 is a block diagram illustrating the structure of the conventional example shown in FIG. 6(A), which is applied to a 2-way division and a 2-way combination.

When the combiner S is used as a 2-combiner in the same manner as described above, the impedance at a combining point P is brought to 25Ω (=50 Ω/2) as shown in FIG. 8. Therefore, the loss produced due to impedance mismatching of an impedance transformer is brought to about 0.5 dB. Thus, the loss in the combiner S and the divider D reaches about 1.0 dB in total.

Even when the 4-way combiner is used as a 3-way combiner or a 2-way combiner as described above, the power combination can be made although only the mismatch loss due to the impedance transformer is produced. The input power division can also be carried out in a manner similar to the power combination. However, a division loss and a combination loss due to mismatching increase when the number of divisions and the number of combinations are reduced.

SUMMARY OF THE INVENTION

It is a general object of the present invention to provide a high-frequency power divider and combiner capable of dividing and combining power at a reduced loss for use in a power amplifying apparatus in which a plurality of power amplifiers are parallel-operated and the output power thereof is controlled by changing the number of the power amplifiers.

In order to achieve the above general object, the present invention provides, in a power amplifying apparatus which includes high-frequency power amplifiers parallel-operated in a range between M and N (M and N: positive integers and M<N) both indicative of the number of the power amplifiers and which makes a change in the number of the parallel-operated power amplifiers to thereby control output power, a high-frequency power divider and combiner comprising a power dividing circuit having an impedance transformer set in such a manner that the power loss is minimized by assigning the intermediate number K (positive integer) between M and N both of which indicate the number of divisions and having N output terminals, and a power combining circuit having an impedance transformer set in such a manner that the power loss is minimized by assigning the intermediate number K corresponding to the number of combinations and having N input terminals.

In order to achieve the above general object, the present invention also provides a high-frequency power divider and combiner wherein a plurality of transmission lines serving as an impedance transformer each having a predetermined impedance and a predetermined line length are connected from respective input terminals of the combiner, the impedance transformation of the impedance transformer is separately made between respective transmission lines electrically connected to the corresponding transmission lines and a combining point and an impedance transformer is electrically connected to the combining point so as to carry out the impedance transformation.

The above and other objects, features and advantages of the present invention will become apparent from the following description and the appended claims, taken in conjunction with the accompanying drawings in which a preferred embodiment of the present invention is shown by way of illustrative example.

DETAILED DESCRIPTION OF THE PREFERRED EMBODIMENTS

Figure 1:
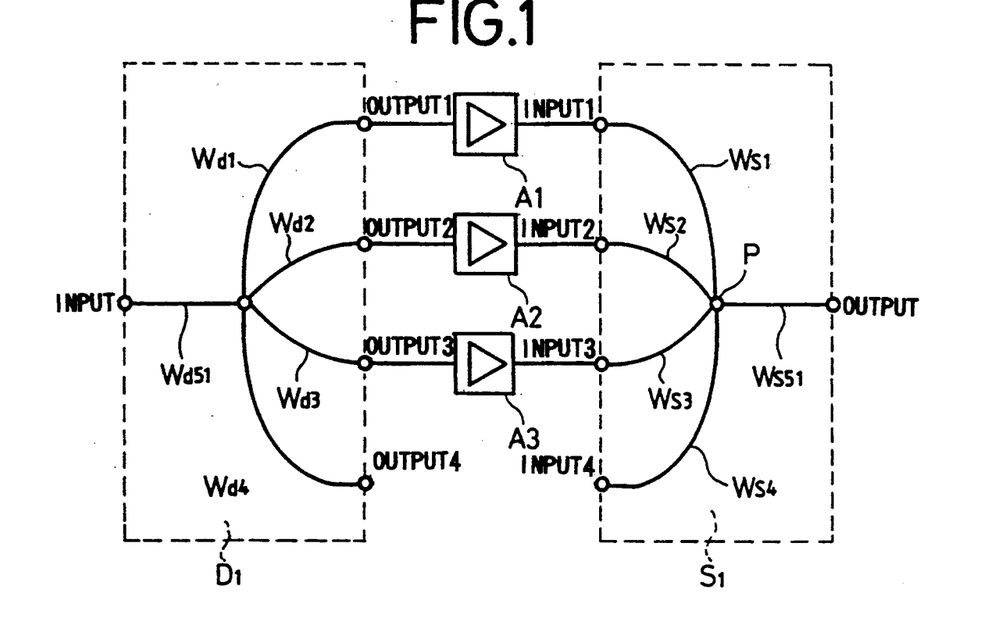
FIG. 1 is a block diagram showing the structure of one embodiment of the present invention.

FIG. 1 is a block diagram showing the structure of one embodiment of the present invention.

The present embodiment illustrates cases in which the number of power combinations ranges from 2 to 4.

In the present embodiment, as shown in FIG. 1, impedance transformer type 4-way divider and 4-way combiner are constructed in such a manner that one of input terminals and one of output terminals are opened, power amplifiers $A_1$, $A_2$ and $A_3$ are parallel-connected to each other and the total power loss is minimized when the output is represented in the form of a 3-way combination.

The 4-way combiner $S_1$ and the 4-way divider $D_1$ are identical in principle to each other. A description will therefore be made of the 4-way combiner $S_1$ as an illustrative example.

Let's now assume that the impedance and length of each of transmission lines $W_{s1}$ to $W_{s4}$, which extend from the power amplifiers $A_1$ to $A_4$ to a combining point P, are 50Ω and nλ/2 respectively in a manner similar to FIG. 6(A). Outputs of impedance 50Ω are 3-way combined and result in the impedance of about 16.7Ω at the combining point P. An impedance transformer, which converts, i.e., transforms the impedance of 16.7Ω at the combining point P into the 50Ω output impedance, is constructed of a transmission line $Ws_{51}$ whose impedance and length are 28.9Ω and λ/4 respectively.

When the 4-way combiner $S_1$ is made up of three parallel-connected power amplifiers and the output of the 4-way combiner $S_1$ is represented in the form of a 3-way combination, the impedance as seen in the direction of provision of the opened input terminal from the combining point P of the 4-way combiner $S_1$ is equivalently regarded as infinite. Further, the loss of the impedance transformer is zero. Since the output of the 4-way combiner $S_1$ is represented in the form of the 3-way combination as described above, no mismatching is developed and the combination loss is theoretically 0 dB.

Further, the 4-way divider $D_1$ is also identical in structure to the 4-way combiner $S_1$. Transmission lines $Wd_1$ to $Wd_4$ correspond to the transmission lines $Ws_1$ to $Ws_4$ and a transmission line $Wd_{51}$ serving as an impedance transformer corresponds to the transmission line $Ws_{51}$. Thus, the division loss is 0 dB and the sum of the division loss and the combination loss is also 0 dB.

Figure 2:
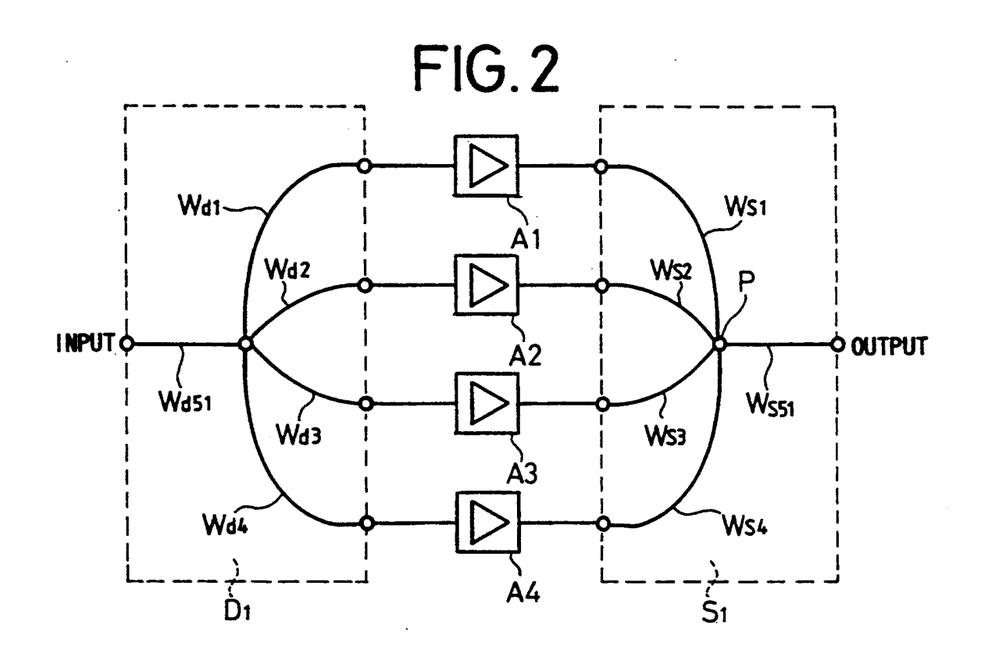
FIG. 2 is a block diagram illustrating the structure of the embodiment shown in FIG. 1, which is applied to a 4-way division and a 4-way combination.

When the output of the above 4-way combiner $S_1$ is represented in the form of a 4-way combination as shown in FIG. 2, another power amplifier is added to the three power amplifiers shown in FIG. 1. In this case, the power loss at the combining point P, which is developed due to mismatching is brought to about 0.09 dB. Similarly to the 4-way combiner $S_1$, 4-way divider $D_1$ is also constructed in such a manner that the power loss is brought to about 0.09 dB. Accordingly, the power loss of the entire apparatus reaches about 0.18 dB.

Figure 3:
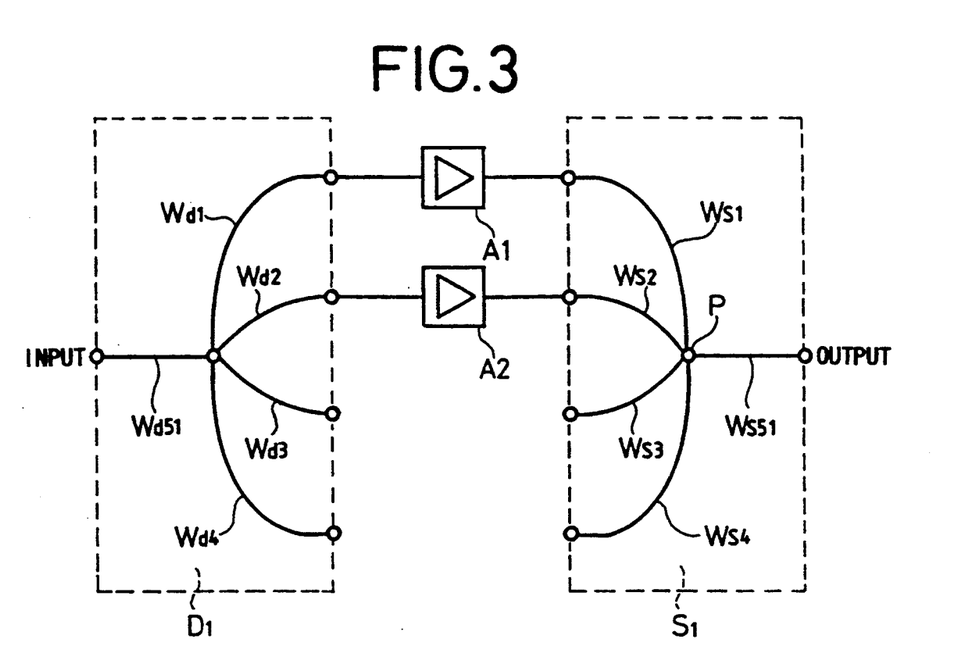
FIG. 3 is a block diagram depicting the structure of the embodiment shown in FIG. 1, which is applied to a 2-way division and a 2-way combination.

When the output of the above 4-way combiner $S_1$ is represented in the form of a 2-way combination as shown in FIG. 3, one power amplifier is removed from the three power amplifiers shown in FIG. 1 and the impedance at the combining point P is brought to 25Ω. In addition, the power loss due to the mismatching of the impedance transformer is brought to about 0.17 dB. Similarly to the combiner $S_1$, divider $D_1$ shown in FIG. 3 is also constructed in such a manner that the power loss is brought to about 0.17 dB. Thus, the power loss of the entire device reaches about 0.34 dB.

If the power loss is minimized as described above when the input of the 4-way divider $D_1$ is represented in the form of 3-way division and the output of the 4-way combiner $S_1$ is represented in the form of a 3-way combination, then the power combination can be made at a low loss when the number of the power amplifiers to be parallel-operated is 4, 3 and 2. It is apparent that the power combination can be performed at the low loss if the loss at the power combination is compared with the cases developed in the conventional examples shown in FIGS. 6(A), 6(B), 7 and 8.

TABLE

| Comparison of losses | conventional | Invention |
|---|---|---|
| parallel connected 4 power amplifiers | 0 db | 0.18 db |
| parallel connected 3 power amplifiers | 0.81 db | 0 db |
| parallel connected 2 power amplifiers | 1.0 db | 0.34 db |

When the divider and combiner according to the present embodiment are now applied to a method of starting the operations of two power amplifiers upon installation and increasing the number of the power amplifiers in order of 3, 4, at a certain period after the installation of the two power amplifiers so as to make an increase in the output power according to a demand, it is possible to increase the number of power amplifiers at constant gain, and since it is unnecessary to make changes in the divider $D_1$ and the combiner $S_1$ the number of the power amplifiers can be increased without temporarily inactivating the power amplifiers. Further, the divider-combiner according to the present invention can be applied to a case where an operation is initiated with 4 power amplifiers connected in parallel with each other, and thereafter, the number of the power amplifiers is decreased to 3, and further to 2.

Therefore, the divider and combiner according to the present embodiment are most suitable for use with, e.g., a base station used to provide mobile telephone service, of a type wherein the station is first operated by a small number of power amplifiers upon installation and the number of the power amplifiers is then increased successively so as to increase power to be transmitted to mobile stations. If the divider and combiner are employed in a system of a type wherein the transmission of a radio wave cannot be stopped even a moment as in the base station, then an increase in the power to be transmitted can be made by simply increasing the number of the power amplifiers without stopping the transmission even a moment. Even when a defect or malfunction arises with any of the amplifiers being operated in parallel, it is possible to maintain the constant gain operation by removing the defective or malfunctioning power amplifier from the system.

The above-described embodiment has shown, as an illustrative example, a case in which the two to four power amplifiers are parallel-operated. However, the number of the power amplifiers to be parallel-operated is not necessarily limited to these numbers and hence any number of power amplifiers can be used. When the number of power amplifiers to be parallel-operated ranges from M to N, the impedance transformer may be constructed by selecting the optimum value in such a manner that the power loss is minimized by an intermediate number K (positive integer) between M and N.

Incidentally, the above-described embodiment has shown the combiner in which the impedance transformation by the impedance transformer is carried out between the combining point P and the output terminal. Further, the present embodiment has also shown the divider in which the impedance transformation is made between the input terminal and the dividing point.

Figure 4:
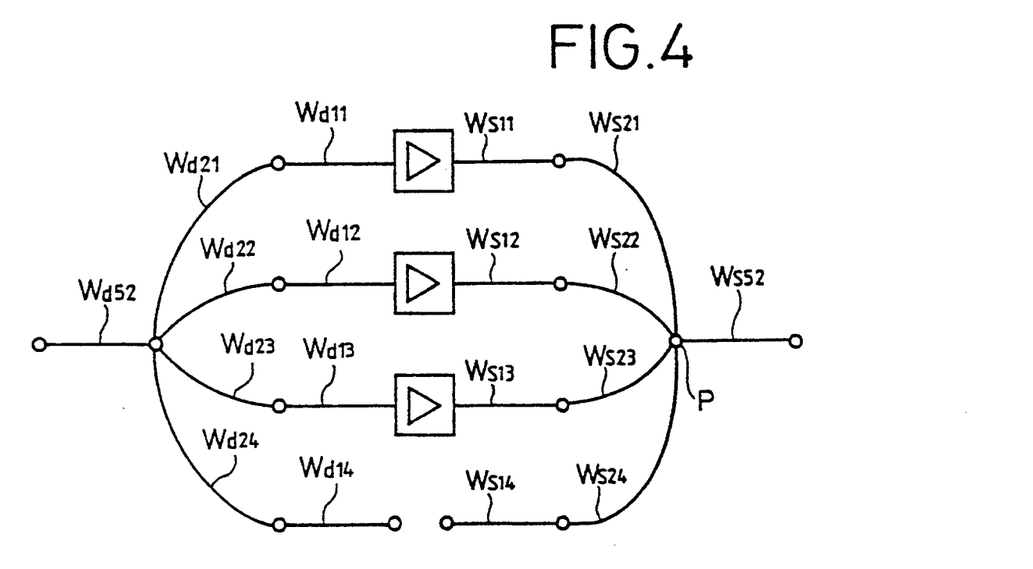
FIG. 4 is a diagram showing the structure of a combiner wherein the impedance transformation of an impedance transformer employed in the embodiment shown in FIG. 1 is performed between respective input terminals and a combining point and between the combining point and an output terminal.

As shown in FIG. 4, however, the impedance transformation can also be made between respective input terminals and a combining point P and between the combining point P and the output terminal. In the illustrated example, transmission lines $Ws_{11}$, $Ws_{12}$, $Ws_{13}$, $Ws_{14}$ each of which has the impedance of 50Ω and a line length of λ/4+nλ/2, are connected from the respective input terminals of the combiners. Further, an impedance transformer is used to transform the impedance of 50Ω into the impedance of 100Ω for each transmission line. As an illustrative example, the impedance transformer is composed of transmission lines $Ws_{21}$, $Ws_{22}$, $Ws_{23}$, $Ws_{24}$ each having an impedance of 70.7Ω and a line length of λ/4, which are electrically connected to their corresponding transmission lines $Ws_{11}$, $Ws_{12}$, $Ws_{13}$, $Ws_{14}$ so as to perform the impedance transformation.

Now, the impedance at the combining point P is brought to 25Ω (=100 Ω/4). An impedance transformer is used to transform the impedance of 25Ω at the combining point P into that of 50Ω. For example, this type of impedance transformer is constructed of a transmission line $Ws_{52}$ which has the impedance of 35.4Ω and a line length of λ/4. Thus, the impedance transformation can be made between the respective input terminals and the combining point P. The divider $D_1$ can also be treated in the same manner as the combiner.

Figure 5:
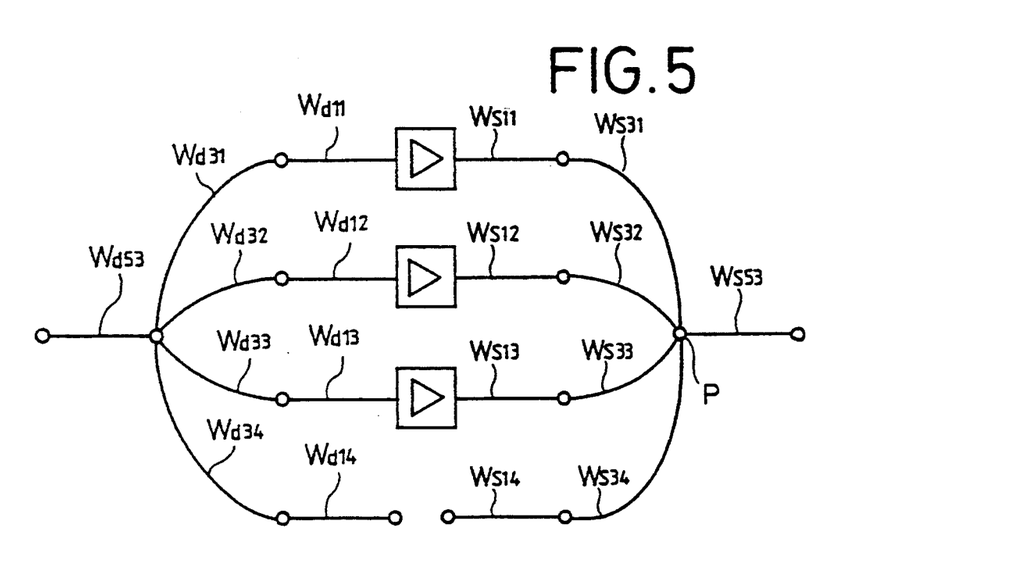
FIG. 5 is a diagram illustrating the structure of another combiner wherein the impedance transformation of the impedance transformer employed in the embodiment shown in FIG. 1 is carried out between respective input terminals and a combining point.

As also shown in FIG. 5, the impedance transformation can also be carried out between respective input terminals and a combining point P. In the illustrated example, transmission lines $Ws_{11}$, $Ws_{12}$, $Ws_{13}$, $Ws_{14}$ each of which has the impedance of 50Ω and a line length of λ/4+nλ/2, are connected from respective input terminals of the 4-way combiner. Further, an impedance transformer is used to transform the impedance of 50Ω into the impedance of 200Ω for each transmission line. As one example, this type of impedance transformer is composed of transmission lines $Ws_{31}$, $Ws_{32}$, $Ws_{33}$, $Ws_{34}$ each having the impedance of 100Ω and a line length of λ/4, which are electrically connected to their corresponding transmission lines $Ws_{11}$, $Ws_{12}$, $Ws_{13}$, $Ws_{14}$ so as to carry out the impedance transformation.

Now, the impedance at a combining point P is brought to 50Ω (=200 Ω/4). Since the impedance at the combining point P is 50Ω, a transmission line $Ws_{53}$ having an impedance of 50Ω and an optional line length electrically connects the combining point P with the output terminal. Thus, the impedance transformation can be carried out between the respective input terminals and the combining point P. The divider $D_1$ can also be treated in the same manner as the combiner.

According to the present invention, as has been described above, there are provided a power dividing circuit having an impedance transformer set in such a manner that the power loss is minimized by assigning an intermediate number K (positive integer) between M and N both of which indicate the number of divisions and having N output terminals, and a power combining circuit having an impedance transformer set in such a manner that the power loss is minimized by assigning the intermediate number K corresponding to the number of combinations and having N input terminals. In addition, the number of power amplifiers to be parallel-operated is changed to make a change in the output power. Therefore, with a small number of power amplifiers first started upon installation to which an increase or decrease in the number of power amplifiers to be parallel-operated is made when a certain period has elapsed after the initial installation, an increase in the power loss can be reduced.

It is also unnecessary to make changes in the divider and combiner each time the increase and decrease in the number of the power amplifiers to be parallel-operated is made. Therefore, if the divider and combiner are employed in the system wherein the transmission of the radio wave cannot be stopped even a moment as in the base station used to provide the vehicle radiotelephone service or communication, then an increase in the power to be transmitted can be made by simply increasing the number of the power amplifiers. Thus, such an increase in the transmission power can be carried out without stopping the power transmission even a moment.

Further, M power amplifiers are parallel-operated at all times provided that one of these is operated as a mounted spare power amplifier. However, if M-1 power amplifiers are parallel-operated in such a manner that their characteristics are satisfied, then a failure in a single power amplifier can be processed without inactivating the device.

In the above, a description has been made of a case in which an input/output interface in a circuit has the impedance of 50Ω. It is however needless to say that an impedance value other than 50Ω may be used.

Having now fully described the invention, it will be apparent to those skilled in the art that many changes and modifications can be made without departing from the spirit or scope of the invention as set forth herein.

What is claimed is:

1. A power divider-combiner for use in a high-frequency power amplifying apparatus which includes a plurality of power amplifiers operated in parallel, the number of said power amplifiers being changeable between M and N, to control a total output power of said power amplifiers without stopping operation of said amplifiers, said power divider-combiner comprising:

a power dividing circuit including a first impedance transformer and N output terminals for supplying respective input signals to said plurality of power amplifiers, wherein said N output terminals branch from an output terminal of said first impedance transformer, and said first impedance transformer is arranged such that a power loss in said power dividing circuit is minimized when the number of division of power is an intermediate number K which is an integer between said M and N, thereby optimizing operation of the power divider-combiner when said intermediate number K of the power amplifiers are connected in parallel; and a power combining circuit including N input terminals for receiving respective output signals from said plurality of power amplifiers, and a second impedance transformer, wherein said N input terminals are connected to an input terminal of said second impedance transformer, and said second impedance transformer is arranged such that a power loss in said power combining circuit is minimized when the number of combinations is said intermediate number K, thereby optimizing said operation of the power divider-combiner.

2. A power divider-combiner according to claim 1, wherein:

said power dividing circuit further includes N output transmission lines for connecting said output terminal of said first impedance transformer with said respective N output terminals, each of said N output transmission lines having a length according to an operating frequency of said power amplifiers; and said power combining circuit further includes N input transmission lines for connecting said respective N input terminals with said input terminal of said second impedance transformer, each of said N input transmission lines having a length according to said operating frequency of said power-amplifiers.

3. A power divider-combiner for use in a high-frequency power amplifying apparatus which includes a plurality of power amplifiers operated in parallel, the number of said power amplifiers being changeable between M and N, where M and N are positive integers and where N is greater than M, to control a total output power of said power amplifiers without stopping operation of said amplifiers, said power divider-combiner comprising:

a power dividing circuit including a first impedance transformer and N output terminals for supplying respective input signals to said plurality of power amplifiers, wherein said N output terminals branch from an output terminal of said first impedance transformer, and said first impedance transformer is arranged such that a power loss in said power dividing circuit is minimized when the number of division of power is an intermediate number K which is an integer between said M and N; and a power combining circuit including N input terminals for receiving respective output signals from said plurality of power amplifiers, and a second impedance transformer, wherein said N input terminals are connected to an input terminal of said second impedance transformer, and said second impedance transformer is arranged such that a power loss in said power combining circuit is minimized when the number of combinations is said intermediate number K;

said power dividing circuit further including N output impedance transformers having respective input terminals which are connected with said output terminal of said first impedance transformer, and N transmission lines respectively coupled between output terminals of said N output impedance transformers and said N output terminals, each of said N output impedance transformers being arranged such that a power loss in said power dividing circuit is minimized when the number of divisions is said intermediate number K, and each of said N output transmission lines having a length according to an operating frequency of said power amplifiers; and said power combining circuit further including N input transmission lines each having one end respectively connected with said N input terminals, and N input impedance transformers respectively coupled between other ends of said N input transmission lines and said input terminal of said second impedance transformer, each of said N input transmission lines having a length according to said operating frequency of said power amplifiers, and each of said N input impedance transformers being arranged such that a power loss in said power combining circuit is minimized when the number of combinations is said intermediate number K.

4. A power divider-combiner for use in a high-frequency power amplifying apparatus which includes a plurality of power amplifiers operated in parallel, the number of said power amplifiers being changeable between M and N, where M and N are positive integers and where N is greater than M, to control a total output power of said power amplifiers without stopping operation of said amplifiers, said power divider-combiner comprising:

a power dividing circuit including a first impedance transformer and N output terminals for supplying respective input signals to said plurality of power amplifiers, wherein said N output terminals branch from an output terminal of said first impedance transformer, and said first impedance transformer is arranged such that a power loss in said power dividing circuit is minimized when the number of division of power is an intermediate number K which is an integer between said M and N; and a power combining circuit including N input terminals for receiving respective output signals from said plurality of power amplifiers, and a second impedance transformer, wherein said N input terminals are connected to an input terminal of said second impedance transformer, and said second impedance transformer is arranged such that a power loss in said power combining circuit is minimized when the number of combinations is said intermediate number K;

said power dividing circuit further including N output impedance transformers having respective input terminals which are connected with said output terminal of said first impedance transformer, and N transmission lines respectively coupled between output terminals of said N output impedance transformers and said N output terminals, each of said N output impedance transformers being arranged such that a power loss in said power dividing circuit is minimized when the number of divisions is said intermediate number K, and each of said N output transmission lines having a length according to an operating frequency of said power amplifiers;

said power combining circuit further including N input transmission lines each having one end respectively connected with said N input terminals, and N input impedance transformers respectively coupled between other ends of said N input transmission lines and said input terminal of said second impedance transformer, each of said N input transmission lines having a length according to said operating frequency of said power amplifiers, and each of said N input impedance transformers being arranged such that a power loss in said power combining circuit is minimized when the number of said combinations is said intermediate number K; and said first impedance transformer and said second impedance transformer respectively comprising transmission lines each having a given length.

5. A power divider-combiner according to claim 2, wherein said transmission lines all have lengths which are an integral multiple of $\lambda/2$, where $\lambda$ is the wavelength at the frequency of operation.

6. A power divider-combiner according to claim 3, wherein said transmission lines all have lengths which are an integral multiple of $\lambda/2$, where $\lambda$ is the wavelength at the frequency of operation.

7. A power divider-combiner according to claim 4, wherein said transmission lines all have lengths which are an integral multiple of $\lambda/2$, where $\lambda$ is the wavelength at the frequency of operation.

* * * * *

UNITED STATES PATENT AND TRADEMARK OFFICE
CERTIFICATE OF CORRECTION

PATENT NO. : 5,363,072
DATED : November 8, 1994
INVENTOR(S) : SAKAMOTO et al.

It is certified that error appears in the above-indentified patent and that said Letters Patent is hereby corrected as shown below:

Title page, Item [73] Assignees, line 2 change:

"Telephone & Telegraph" to --Telegraph & Telephone--

Signed and Sealed this

Eighteenth Day of June, 1996

Attest:

BRUCE LEHMAN

Attesting Officer

Commissioner of Patents and Trademarks